(12) United States Patent
Gerard et al.

(10) Patent No.: US 6,472,937 B1
(45) Date of Patent: Oct. 29, 2002

(54) BIAS ENHANCEMENT CIRCUIT FOR LINEAR AMPLIFIERS

(75) Inventors: Michael L. Gerard; Terry J. Shie, both of Cedar Rapids; Philip H. Thompson, Mt. Vernon, all of IA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/715,871

(22) Filed: Nov. 15, 2000

(51) Int. Cl.⁷ .................................................. H03G 5/16
(52) U.S. Cl. ......................... 330/133; 330/285; 330/85
(58) Field of Search ................................. 330/133, 285, 330/296, 302, 310, 85, 134

(56) References Cited

U.S. PATENT DOCUMENTS

| | | | |
|---|---|---|---|
| 4,767,946 A | * 8/1988 | Taylor | 307/264 |
| 5,177,449 A | 1/1993 | Asazawa | |
| 5,548,248 A | 8/1996 | Wang | |
| 5,739,723 A | 4/1998 | Sigmon et al. | |
| 5,929,708 A | 7/1999 | Davis et al. | |
| 6,130,579 A | 10/2000 | Iyer et al. | |
| 6,172,567 B1 | * 1/2001 | Ueno et al. | 330/285 |
| 6,300,826 B1 | * 10/2001 | Mathe et al. | 330/10 |

OTHER PUBLICATIONS

"Improve the Effciency of RF Power Amplifiers", RFDesign; Jun. 1999, pp. 53–54 and 63.
Website Pages associated with "A Dynamic Current Control Scheme for RF Power Amplifiers", Number of pages 4, Website Address: http://www.rfmd.com/DataBooks/db97/Ta0035.pdf, Download date Nov. 15, 2000.

"GaAs HBT Power Amplifier With Smooth Gain Control Characteristics" by Esko Jarvinen; pp. 321–324,; IEEE, 1998.

* cited by examiner

*Primary Examiner*—Robert Pascal
*Assistant Examiner*—Henry Choe
(74) *Attorney, Agent, or Firm*—Sonnenschein Nath & Rosenthal

(57) ABSTRACT

The invention includes an amplifier and a biasing circuit. The amplifier may have one or more driver stages and a final stage. Each stage may be connected in series to pass along and amplify an input signal from one stage to the next. The input signal level may increase over time. The biasing circuit may include a voltage follower having an output and a reference transistor. Each stage may include a transistor having a base that is connected to the output of the voltage follower. A resistor may be placed between each transistor stage base and the output of the voltage follower. The base of the final stage transistor may be DC connected to the reference transistor base. In operation, the reference transistor collector current and thus the final stage base bias voltage may be maintained at fixed level by feedback through the voltage follower. However, the base bias current of the final stage and, thus, the voltage drop across the final stage base bias resistor and the voltage follower output voltage may increase with the input signal level. The increase in the voltage follower output voltage, in turn, may increase the base bias voltage of one or more driver stages. The increase of the base bias voltage of a driver stage as a function of an increase in the input signal level may extend the amplifier gain compression point to a higher output power level.

14 Claims, 4 Drawing Sheets

BIAS ENHANCEMENT CIRCUIT FOR LINEAR AMPLIFIERS

BACKGROUND OF THE INVENTION

1. Technical Field

The invention relates to amplifiers, and in particular to amplifiers that have gain control through a biasing circuit.

2. Related Art

In today's society, both the presence and use of communication systems are increasing at a rapid pace. Wireless and broadband communication systems and infrastructures continue to grow. This acceleration has created a strong and ever-growing market for electronic equipment that employs more powerful, efficient, and inexpensive communication components.

Electronic equipment such as computers, wireless devices, broadband devices (i.e., standard telephones), radios, televisions and other similar devices may communicate with one another by passing transmission signals through free-space (i.e., air and space) and through guided mediums such as wire, cable, microwave, millimeter wave, sonic, and optical connections. These transmission signals go through a variety of processing during their communication. One process involves amplifying the transmission signals.

Conventionally, a multistage amplifier controlled by a biasing circuit is utilized to linearly increase the power of a transmission signal from its power level at an input of the amplifier to the desired power level at an output of the amplifier. For an input transmission signal having a low power level, each stage of the amplifier generally receives sufficient current from the power supply of the device to operate. As the power level of the input transmission signal increases, each stage of the amplifier may require additional current to operate. The biasing circuit detects the increase in the input transmission signal power level in an amplifier stage and, in response, supplies the additional current to that amplifier stage.

Although this additional current enables the amplifier stage to continue its amplification operation, it also causes the amplifier stage to experience compression. When an amplifier stage experiences compression, its actual output is less than a desired output. For example, if an amplifier stage is to give a gain of 5 decibels (dB) to a transmission signal but only gives 4.5 dB, that amplifier stage can be characterized as experiencing compression. Extreme input transmission signal power levels may actually cause the amplifier stage to shut itself down.

When the power level of the input transmission signal reaches a threshold value, the compression of the amplifier stage reaches a point at which its output is less effective. It is desirable to extend the amplifier gain compression point to a higher output power level.

SUMMARY

A system is described to extend an amplifier gain compression point to a higher output power level. Broadly conceptualized, the system may include a multistage amplifier and an enhanced biasing circuit that amplify an input signal. The enhanced biasing circuit may included a voltage follower connected to each stage of the amplifier. Between each voltage follower/amplifier stage connection may be a resistor. Each resistor may increase the power amplification capabilities of an adjacent, upstream amplifier stage in advance of an increase of the input signal so as to extend the gain compression point of the amplifier to an output power level that is higher than conventional amplifiers.

A process performed by the system may include receiving at a driver stage of the amplifier an input signal having a power level that increases over time. The driver stage may amplify this input signal to form an interstage signal that is passed to final stage of the amplifier. The power level of the interstage signal may cause the final stage of the amplifier to draw current from a voltage follower within the biasing circuit. This current may pass through a final stage resistor connected between the voltage follower and the final stage of the amplifier.

Drawing current through the final stage resistor may cause a voltage drop across the final resistor so that the voltage follower output voltage increases. The increase in the voltage follower output voltage, in turn, may increase the voltage over an upstream resistor. The upstream resistor voltage increase may increase the base bias voltage of a driver stage as a function of an increase in the input signal power level and in advance of receiving an increase in the input signal power level. This may increase capabilities of each driver stage so that the overall effect works to extend the amplifier gain compression point to a higher output power level.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION OF THE INVENTION

Figure 1:
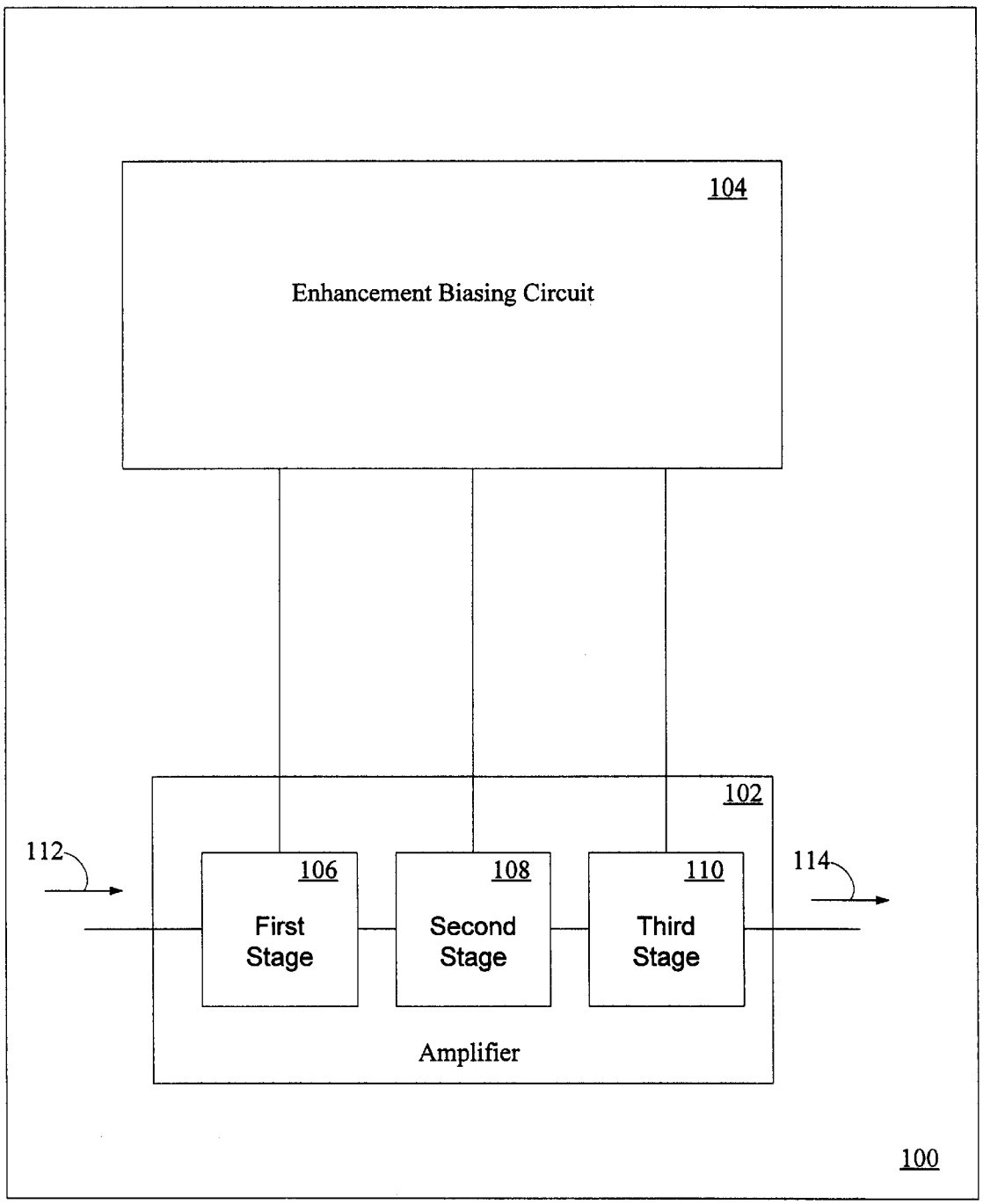
FIG. 1 illustrates block diagram 100.

FIG. 1 illustrates block diagram 100. Block diagram 100 may include amplifier 102 and enhanced biasing circuit 104. Amplifier 102 may include first stage 106, second stage 108, and third stage 110. Each stage may be connected in series to pass along input signal 112 and amplify the power level of input signal 112 from one stage to the next so as to produce output signal 114. The power level of output signal 112 may be a linear amplification of the power level of input signal 112.

Amplifier 102 may include a plurality of stages where the last stage may be thought of as the final stage and the remaining stages may be thought of as driver stages. Enhanced biasing circuit 104 is coupled to amplifier 102 so as to control the power amplification of each stage of amplifier 102.

Figure 2:
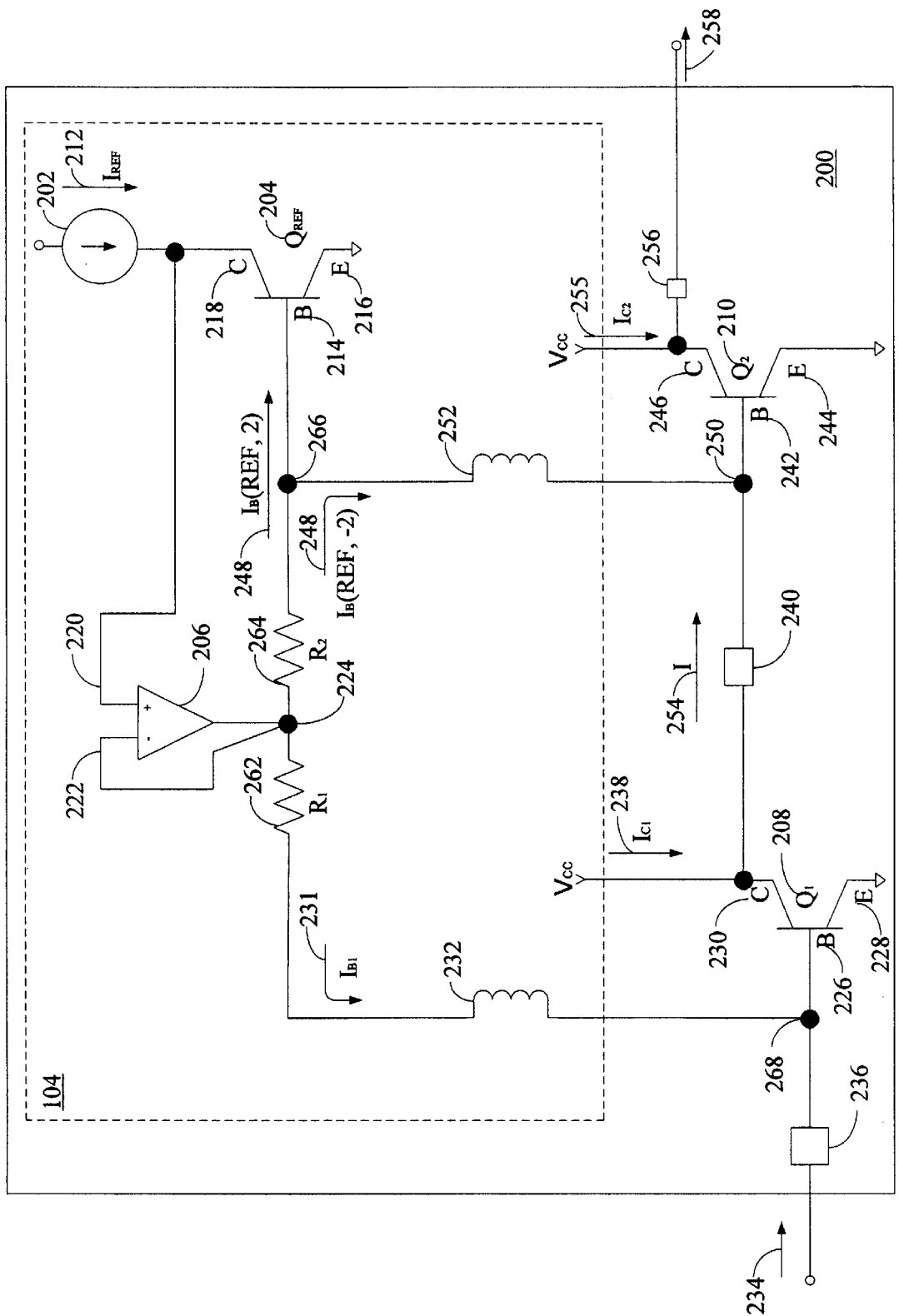
FIG. 2 illustrates an exemplar circuit of the block diagram of FIG. 1.

FIG. 2 illustrates circuit 200. Circuit 200 is an exemplar implementation of block diagram 100 of FIG. 1. Included with circuit 200 may be reference current source 202, reference transistor ($Q_{REF}$) 204, voltage follower 206, first stage transistor ($Q_1$) 208, and second stage transistor (Q2) 210. Reference transistor 204, first stage transistor 208, and second stage transistor 210 may share similar properties. Here, reference transistor 204, first stage transistor 208, and second stage transistor 210 are shown as Bipolar Junction Transistors (BJT) and may be referred to as matched transistors, even though their active areas differ.

Reference current source 202 produces reference current ($I_{REF}$) 212. Reference transistor 204 includes base 214, emitter 216, and collector 218 and is coupled to reference current source 202 at collector 218.

Voltage follower 206 may be any device whose output voltage is equal to its input voltage. Examples of voltage follower 206 may include an operational amplifier as shown in FIG. 2, a metal oxide semiconductor (MOS) device connected in a common drain configuration, and a bipolar transistor (BJT) device connected in a common collector configuration.

Voltage follower 206 includes first input 220, second input 222, and output 224. First input 220 is coupled to reference current source 202 to receive reference current 212. Second input 222 may be thought of as the inverting or negative input terminal and is coupled to output 224. Under this arrangement, second input 222 may be thought of as applying negative feedback to voltage follower 206. Output 224 may be coupled to base 214 of transistor 204.

Voltage follower 206 may be viewed as having a relatively high input impedance so as to prevent any significant current from passing from input 220 to output 224. However, there may be offset between the input voltage and the output voltage of voltage follower 206. Additionally, voltage follower 206 ideally may be viewed as having a relatively low output impedance that permits voltage follower 206 to output a relatively large current without affecting the voltage at output 224.

First stage transistor ($Q_1$) 208 may include base 226, emitter 228, and collector 230. Base 226 may be coupled to output 224 of voltage follower 206 to receive first base current ($I_{B1}$) 231. To avoid any interaction between a radio frequency (RF) signal input passed through first stage transistor 208, radio frequency choke (RFC) 232 is placed in the path between output 224 and base 226. RFC 232 may include a high impedance at the RF frequencies of interest.

Base 226 of first stage transistor 208 is coupled to receive input signal 234 through input matching network 236. Input signal 234 may include an alternating current that is part of a radio frequency signal, where the radio frequency signal may define an amplitude that varies over time. Input signal 234 may be other than radio waves, such as microwave, millimeter wave, and optical. Input matching network 236 transforms the impedance at base 226 either up to or down to the desired impedance (typically fifty ohms).

Emitter 228 of first stage transistor 208 may be coupled to emitter 216 of reference transistor 204. Collector 230 may be connected to sink first collector current ($I_{C1}$) 238.

Second stage transistor (Q2) 210 includes base 242, emitter 244, and collector 246. Base 242 may be coupled to output 224 of voltage follower 206 to receive second base current ($I_{B(REF,2)}$) 248 though node 250. Radio frequency choke (RFC) 252 may be placed between output 224 and base 242. Base 242 of second stage transistor 210 is coupled to collector 230 through matching network 240 to receive interstage signal 254.

Emitter 244 may be coupled to emitter 228 of first stage transistor 208 and to emitter 216 of reference transistor 204. Collector 246 may be connected to sink second collector current ($I_{C2}$) 256. From collector 246, output signal 258 may be passed through output matching network 256.

In addition, circuit 200 includes first resistor ($R_1$) 262 and second resistor ($R_2$) 264. First resistor 262 is disposed between output 224 of voltage follower 206 and node 268. Second resistor 264 is disposed between output 224 and node 250. In general, circuit 200 may include any number of transistor stages where each transistor stage may include a resistor coupled to the base of that transistor stage.

First resistor 262 and second resistor 264 may be any electrical device having components that resist the flow of electrical current. An example may be a wire. First resistor 262 and second resistor 264 each may be a device that permits management of current in circuit 200 by providing resistance. Moreover, first resistor 262 and second resistor 264 each may be a combination of discrete components that may add resistance to circuit 200.

First resistor 262 and second resistor 264 may include material such as carbon, silicon, and metal. In one embodiment, at least one of first resistor 262 and second resistor 264 includes a plurality of resistors. In another embodiment, at least one of first resistor 262 and second resistor 264 may be a variable resistor, such as at least one of a potentiometer, a voltage divider, and a rheostat.

The area (A) of a transistor may be thought of as an integer number of unit cells. The value of first resistor 262 and second resistor 264 may be scaled by the ratio of the area of second transistor 210 to first transistor 208 such that $R_1/R_2 = A_{Q2}/A_{Q1}$.

In one embodiment, the ratio of the area of second transistor 210 to first transistor 208 is ten unit cells to one unit cells. Thus, in this embodiment, the ratio of first resistor 262 to second resistor 264 may one to ten.

Figure 3:
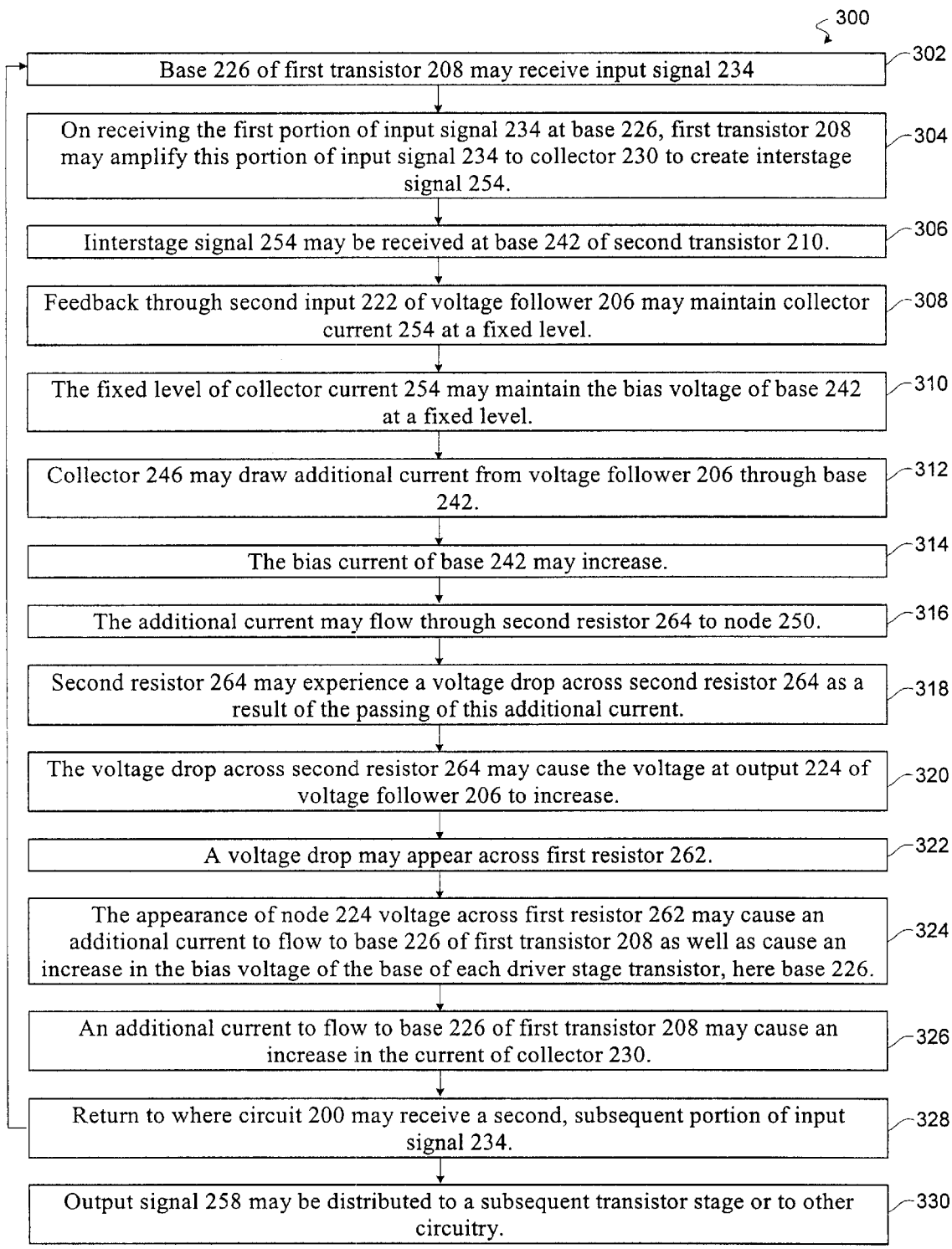
FIG. 3 illustrates an exemplar process of the block diagram of FIG. 1.

FIG. 3 illustrates process 300. Process 300 may employ circuit 200 of FIG. 2. At 302, base 226 of first transistor 208 may receive input signal 234. Input signal 234 may have a power level that varies over time such that each portion of input signal 234 received at base 226 may define a particular power level the moment of receipt at base 226. The moment of receipt at base 226 may be viewed as receipt of a portion of input signal 234. Accordingly, the portion of input signal 234 received at base 226 at 302 may be viewed as a first portion of input signal 234. Further, the power level of the first portion of input signal 234 may be less than the power level of a second portion of input signal 234.

On receiving the first portion of input signal 234 at base 226, first transistor 208 may amplify this portion of input signal 234 to collector 230 at 304 to create interstage signal 254. At 306, interstage signal 254 is received at base 242 of second transistor 210. At 308, feedback through second input 222 of voltage follower 206 may maintain collector current 255 at a fixed level. At 310, the fixed level of collector current 255 may maintain the bias voltage of base 242 at a fixed level.

Receiving interstage signal 254 at base 242 of second transistor 210 at 306 may work to cause second collector current 255 to drive up. For second collector current 255 to drive up in view of the present power level of interstage signal 254, second collector current 255 requires more current at base 242 than presently being delivered by circuit 200. Accordingly, at 312, collector 246 may draw additional current from voltage follower 206 through base 242. As a result, the bias current of base 242 may increase at 314.

In circuit 200, the biasing requirement of second transistor 210 relative to interstage signal 254 will be lower than the biasing requirement of first transistor 208 relative to input signal 234. This may be a result of the selection of matching network 236, first transistor 208, matching network 240, and second transistor 210. This arrangement may work so that the final transistor stage of circuit 200, here second transistor 210, may begin to draw current from voltage follower 206 before any upstream stage begins to draw current from voltage follower 206. The invention takes advantage of this phenomenon to increase the current supplied to the bases of the upstream transistor stages in advance of receiving subsequent input signals 234.

At 316, the additional current flows through second resistor 264 to node 250. At 318, second resistor 264 may experience a voltage drop across second resistor 264 as a result of the passing of this additional current. At 320, the voltage drop across second resistor 264 may cause the voltage at output 224 of voltage follower 206 to increase.

Increasing the voltage at output 224 may cause a voltage drop across a prior stage base bias resistor. Accordingly, at 322, a voltage drop may appear across first resistor 262. At 324, the appearance of node 224 voltage across first resistor 262 may cause an additional current to flow to base 226 of first transistor 208 as well as cause an increase in the bias voltage of the base of each driver stage transistor, here base 226.

The increase in the bias voltage of base 226 occurs in advance of an increase in the power level of input signal 234 experienced at base 226. This increase in upstream transistor stage base current ahead of an increase in the power level of the input signal is distinguished from conventional circuits. Under conventional techniques, any increase in upstream transistor stage base current occurs behind an increase in the input signal power level. Moreover, under conventional techniques, any increase in upstream transistor stage base current occurs independent of other base current increases in the remaining transistor stages.

At 326, an additional current to flow to base 226 of first transistor 208 may cause an increase in the current of collector 230. An increase in the current of collector 230 permits first transistor 208 to handle a subsequent increase in the power level of input signal 234 as well as provide a greater gain through first transistor 208 for input signal 234. In other words, the increase of the base bias voltage of a driver stage as a function of an increase in the input signal level may extend the amplifier gain compression point to a higher output power level. At 328, process 300 may return to where circuit 200 receives a second, subsequent portion of input signal 234. At 330, output signal 258 may be distributed to a subsequent transistor stage or to other circuitry.

Figure 4:
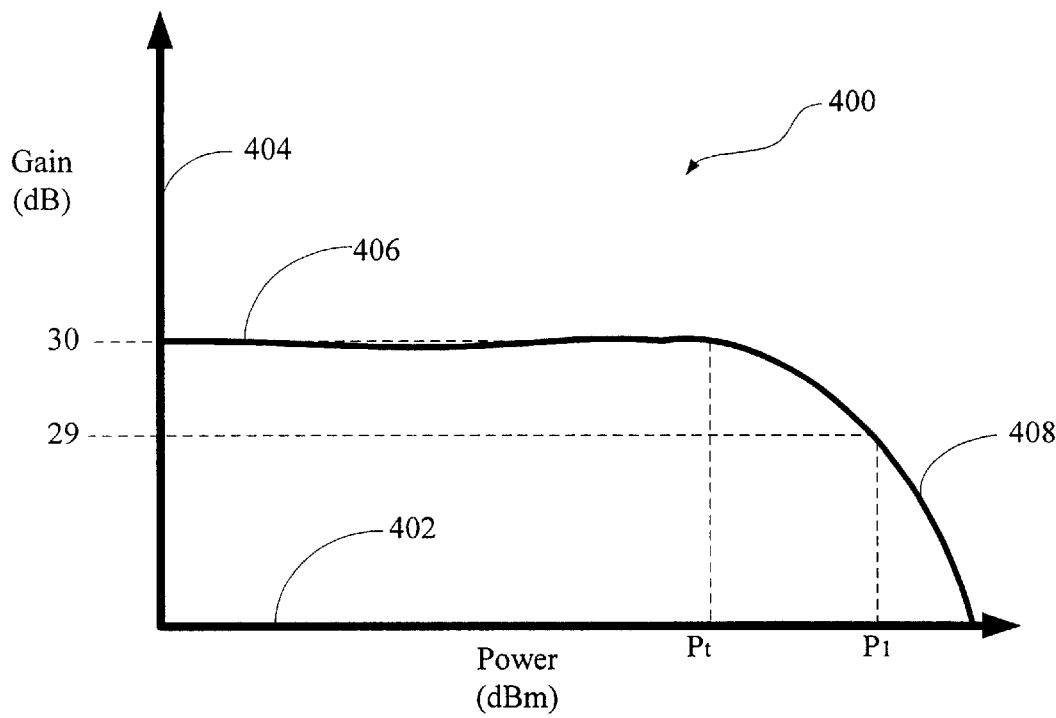
FIG. 4 illustrates plot 400 of a signal output from a conventional amplifying circuit.

FIG. 4 illustrates plot 400 of a signal output from a conventional amplifying circuit. Horizontal axis 402 is a measure of power in units of decibels relative to a milliwatt (dBm). Vertical axis 404 is a measure of the gain in decibels (db) desired for the input signal. Assume that the desired gain for the input signal through the conventional amplifying circuit is 30-dB. A decrease of 1-dB from the desired gain provides a cutoff point for effective gain. When the power level of the input signal is low, the conventional amplifying circuit may achieve the desired gain of 30-dB as illustrated by plot line 406 of FIG. 4.

When the power level of the input signal reaches the threshold power level ($P_t$), the ability of the amplifier of the conventional amplifying circuit to produce a gain of 30-dB begins to decrease. At this point, each transistor stage begin to compress. As the power level of the input signal increases from threshold power level ($P_t$) to the first power level ($P_1$), the gain from the conventional amplifying circuit drops 1-dB to 29-dB. Here, the gain is still considered effective. This drop in gain is shown by compression curve 408. Compression curve 408 may be viewed as a soft corner. As the power level of the input signal increases beyond the first power level ($P_1$), the gain decreases beyond 1-dB so that the gain experienced by input signal 234 over the conventional amplifying circuit is no longer effective.

Figure 5:
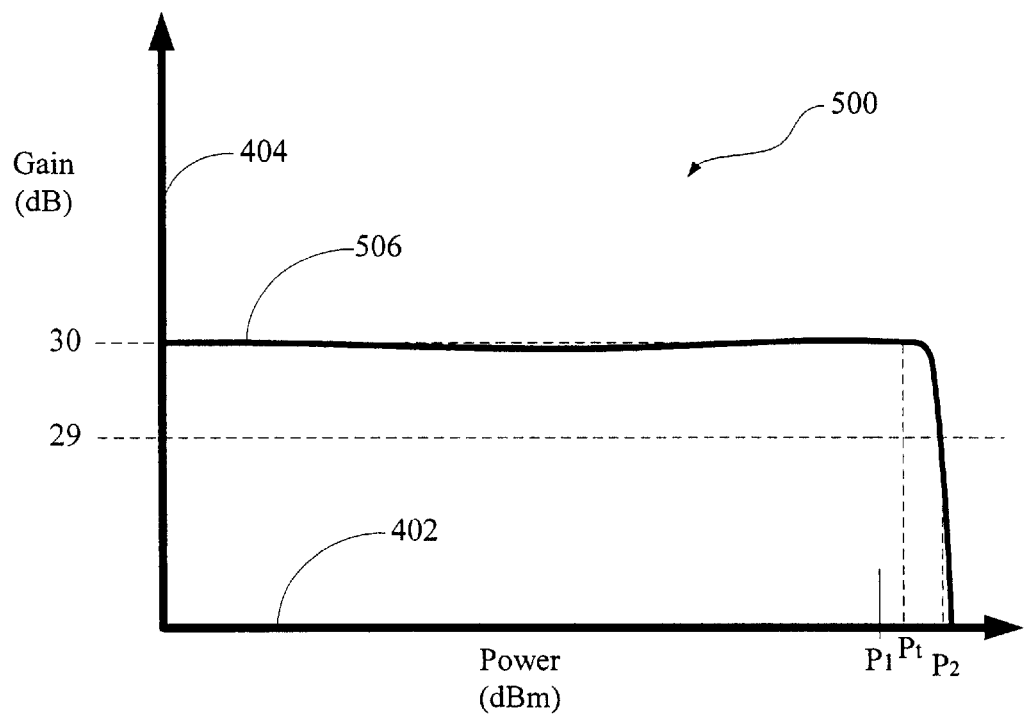
FIG. 5 illustrates plot 500 of signal output 258 of circuit 200 of FIG. 2 versus gain.

FIG. 5 illustrates plot 500 of signal output 258 of circuit 200 of FIG. 2 versus gain. When the power level of input signal 234 is low, circuit 200 may achieve the desired gain of 30-dB as illustrated by plot line 506 of FIG. 5. Plot line 506 may be somewhat curved since compensating for compression in second stage transistor 210 by driving up first stage transistor 208 may not yield exact linear results.

When the power level of input signal 234 reaches the first power level ($P_1$), the gain of circuit 200 is still within 1-dB of the desired gain of 30-dB. When the power level of input signal 234 reaches the threshold power level ($P_t$), the ability of the amplifier of circuit 200 to produce a gain of 30-dB begins to decrease. At this point, each transistor stage (here, first transistor 208 and second transistor 210 of FIG. 2) begin to compress over a sharp corner.

On comparing plot 400 of FIG. 4 to plot 500 FIG. 5, it can be seen that circuit 200 provides useful gain at high power levels as compared to conventional amplifying circuits. Circuit 200 may handle power levels that are 1.7 times greater than the power levels that may be handled by current mirror 200 such that $P_2 \cong 1.7 \times (P_1)$.

The exemplary embodiments described herein are provided merely to illustrate the principles of the invention and should not be construed as limiting the scope of the subject matter of the terms of the claimed invention. The specification and drawings are, accordingly, to be regarded in an illustrative rather than a restrictive sense. Moreover, the principles of the invention may be applied to achieve the advantages described herein and to achieve other advantages or to satisfy other objectives, as well.

What is claimed is:

1. A circuit comprising:
   a voltage follower having an output;
   a reference transistor having a base coupled to the output of the voltage follower;
   a first stage transistor having a base coupled to the output of the voltage follower through a first resistor; and
   a second stage transistor having a base coupled to the output of the voltage follower through a second resistor,
   wherein a ratio of a first resistor value of the first resistor and a second resistor value of the second resistor is scaled by a ratio of an area of the second stage transistor to an area of the first stage transistor.

2. The circuit of claim 1, wherein at least one of the first resistor and the second resistor is an electrical device having components that resist the flow of electrical current.

3. The circuit of claim 1, wherein at least one of the first resistor value of the first resistor and the second resistor value of the second resistor is derived from a plurality of resistors.

4. The circuit of claim 1, wherein at least one of the first resistor value of the first resistor and the second resistor value of the second resistor is derived from a variable resistor.

5. The circuit of claim 4, wherein the variable resistor is at least one of a potentiometer, a voltage divider, and a rheostat.

6. The circuit of claim 1, wherein the base of the reference transistor is coupled to the output of the voltage follower through the second resistor.

7. The circuit of claim 6, wherein the ratio of the first resistor value to the second resistor value is one to ten.

8. The circuit of claim 1, further comprising:
   a first choke disposed between the output of the voltage follower and the base of the first stage transistor;
   a second choke disposed between the output of the voltage follower and the base of the second stage transistor;
   an input matching network coupled to the base of the first stage transistor;
   an interstage matching network coupled to the base of the second stage transistor; and
   an output matching network coupled to a collector of the second stage transistor.

9. A circuit comprising:
   a voltage follower having an output;
   a reference transistor having a base coupled to the output of the voltage follower;
   a first stage transistor having a base coupled to the output of the voltage follower through a first means for resisting; and
   a second stage transistor having a base coupled to the output of the voltage follower through a second means for resisting,
   wherein a ratio of a first resistor value of the first means for resisting and a second resistor value of the second means for resisting is scaled by a ratio of an area of the second stage transistor to an area of the first stage transistor.

10. The circuit of claim 9, wherein at least one of the first means for resisting and the second means for resisting is an electrical device having components that resist the flow of electrical current.

11. The circuit of claim 9, wherein at least one of the first means for resisting and the second means for resisting is at least one of a potentiometer, a voltage divider, and a rheostat.

12. A method, comprising:
   receiving an interstage signal at a base of a second stage transistor from a collector of a first stage transistor;
   drawing current from an output of a voltage follower through a second resistor to the base of the second stage transistor so as to form a voltage drop over the second resistor;
   in response to the voltage drop over the second resistor, forming a voltage drop over a first resistor coupled to the output of the voltage follower so as to generate a first resistor current at the first resistor; and
   passing the first resistor current to a base of the first stage transistor so as to increase a current in the collector of the first stage transistor.

13. The method of claim 12, wherein the interstage signal is based on a first portion of an input signal, wherein the first portion defines a first amplitude, the method further comprising:
   subsequent to passing the first resistor current to the base of the first stage transistor, receiving a second portion of the input signal at the base of the first stage transistor, where the second portion defines a second amplitude that is greater than the first amplitude.

14. The method of claim 12, wherein forming a voltage drop over a first resistor includes forming a voltage drop over a first resistor having a value that is scaled by the ratio of the area of the second stage transistor to the area of the first stage transistor times a value of the second resistor.

* * * * *